United States Patent
Shigei et al.

(10) Patent No.: US 11,521,951 B2
(45) Date of Patent: Dec. 6, 2022

(54) WRISTBAND TYPE ELECTRONIC DEVICE

(71) Applicant: SONY CORPORATION, Tokyo (JP)

(72) Inventors: Hiroyuki Shigei, Tokyo (JP); Toru Amano, Tokyo (JP); Toshio Enokido, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 118 days.

(21) Appl. No.: 16/981,846

(22) PCT Filed: Jan. 28, 2019

(86) PCT No.: PCT/JP2019/002691
§ 371 (c)(1),
(2) Date: Sep. 17, 2020

(87) PCT Pub. No.: WO2019/187579
PCT Pub. Date: Oct. 3, 2019

(65) Prior Publication Data
US 2021/0118845 A1    Apr. 22, 2021

(30) Foreign Application Priority Data

Mar. 29, 2018 (JP) .............................. JP2018-063430
Nov. 12, 2018 (JE) .............................. JP2018-212268

(51) Int. Cl.
| | | |
|---|---|---|
| H01L 25/04 | (2014.01) |
| H01L 25/075 | (2006.01) |
| H01L 33/50 | (2010.01) |
| H01L 33/60 | (2010.01) |
| H01L 51/50 | (2006.01) |
| H01L 51/52 | (2006.01) |
| H01L 51/56 | (2006.01) |

(52) U.S. Cl.
CPC ........ *H01L 25/048* (2013.01); *H01L 25/0753* (2013.01); *H01L 33/50* (2013.01); *H01L 33/60* (2013.01); *H01L 51/5036* (2013.01); *H01L 51/5271* (2013.01); *H01L 51/56* (2013.01); *H01L 2933/005* (2013.01); *H01L 2933/0041* (2013.01)

(58) Field of Classification Search
CPC ... H01L 25/048; H01L 25/0753; H01L 33/50; H01L 51/5271
See application file for complete search history.

(56) References Cited

U.S. PATENT DOCUMENTS

| | | | | |
|---|---|---|---|---|
| 2012/0218496 | A1* | 8/2012 | Izawa | G02F 1/133609 252/301.4 F |
| 2016/0043341 | A1* | 2/2016 | Heo | H01L 27/3279 438/23 |
| 2017/0358624 | A1* | 12/2017 | Takeya | H01L 25/167 |

FOREIGN PATENT DOCUMENTS

| | | |
|---|---|---|
| JP | 2006-059728 A | 3/2006 |
| JP | 2007-248484 A | 9/2007 |
| JP | 2011-141965 A | 7/2011 |
| WO | WO 2011/068072 A1 | 6/2011 |
| WO | WO 2012/043611 A1 | 4/2012 |

\* cited by examiner

*Primary Examiner* — Jay C Chang
*Assistant Examiner* — Mikka Liu
(74) *Attorney, Agent, or Firm* — Paratus Law Group, PLLC

(57) ABSTRACT

An electronic device includes a plurality of light emitting units mounted on a substrate, and an opening that is provided so as to correspond to each of the light emitting units and guides light emitted from the light emitting units to an outside.

17 Claims, 10 Drawing Sheets

A

B

C

FIG. 11
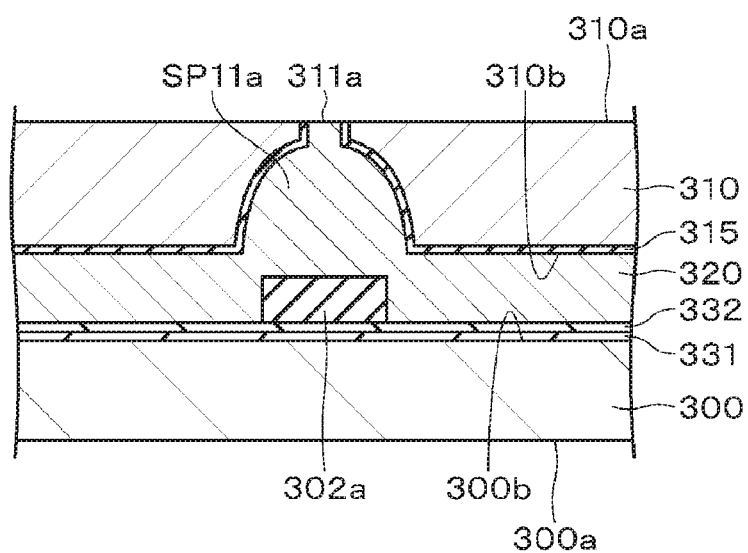
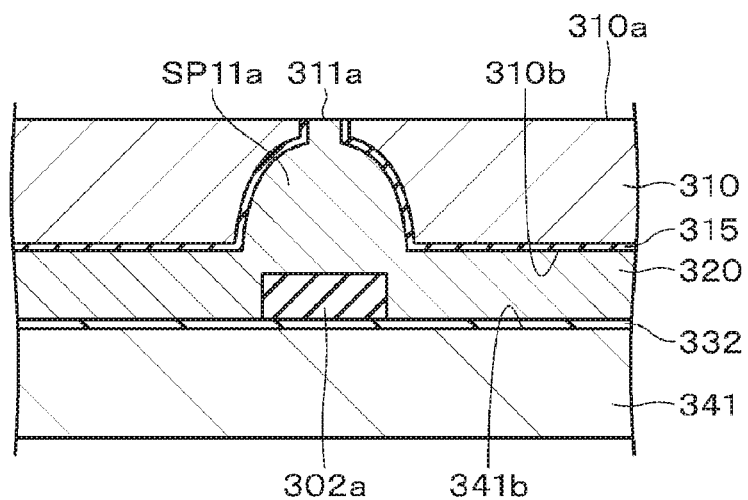

FIG. 12
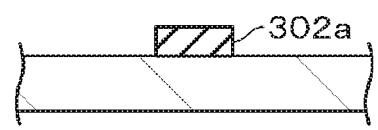
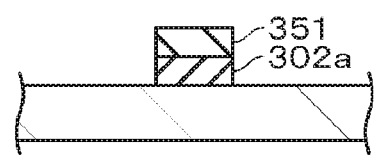
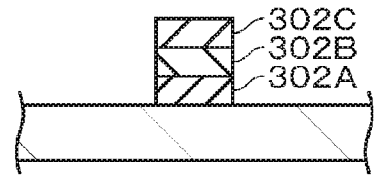

WRISTBAND TYPE ELECTRONIC DEVICE

CROSS REFERENCE TO PRIOR APPLICATION

This application is a National Stage Patent Application of PCT International Patent Application No. PCT/JP2019/002691 (filed on Jan. 28, 2019) under 35 U.S.C. § 371, which claims priority to Japanese Patent Application Nos. 2018-063430 (filed on Mar. 29, 2018) and 2018-212268 (filed on Nov. 12, 2018), which are all hereby incorporated by reference in their entirety.

TECHNICAL FIELD

The present disclosure relates to an electronic device, a method for manufacturing the electronic device, and an apparatus for manufacturing the electronic device.

BACKGROUND ART

Conventionally, various display devices have been proposed. For example, Patent Document 1 below describes a flat-panel display device in which a large number of cold cathode elements that emit electrons are arranged in a matrix.

CITATION LIST

Patent Document

Patent Document 1: Japanese Patent Application Laid-Open No. 2006-59728

SUMMARY OF THE INVENTION

Problems to be Solved by the Invention

In such fields, it is desired to improve display performance.

An object of the present disclosure is to provide an electronic device, a method for manufacturing the electronic device, and an apparatus for manufacturing the electronic device that can improve the display performance.

Solutions to Problems

The present disclosure is, for example, an electronic device including:
a plurality of light emitting units mounted on a substrate; and
an opening that is provided so as to correspond to each of the light emitting units and guides light emitted from the light emitting unit to an outside.

Furthermore, the present disclosure is, for example, a method for manufacturing an electronic device, the method including:
filling a filler containing a re-emitting unit in an internal space that is included in a base and has a shape tapered toward an opening so that the re-emitting unit is stored near the opening; and
curing the filled filler.

Furthermore, the present disclosure is, for example, an apparatus for manufacturing an electronic device, the apparatus including:
a filling unit that fills a filler containing a re-emitting unit in an internal space that is included in a base and has a shape tapered toward an opening so that the re-emitting unit is stored near the opening, and
a filler curing unit that cures the filled filler.

Effects of the Invention

According to at least one embodiment of the present disclosure, display performance can be improved. The effect described here is not necessarily limited, and may be any effect described in the present disclosure. Furthermore, the contents of the present disclosure are not to be construed as being limited by the illustrated effect.

BRIEF DESCRIPTION OF DRAWINGS

FIG. 11A and FIG. 11B are views for describing modification examples of the second embodiment.

FIG. 12A to FIG. 12C are views for describing modification examples of the second embodiment.

MODE FOR CARRYING OUT THE INVENTION

Hereinafter, embodiments and the like of the present disclosure will be described with reference to the drawings. Note that the description will be made in the following order.
<1. First embodiment>
<2. Second embodiment>
<3. Modification example>
The embodiments and the like described below are preferred specific examples of the present disclosure, and the contents of the present disclosure are not limited to these embodiments and the like.

1. First Embodiment

[About Wristband Type Electronic Device]
(External Appearance of Wristband Type Electronic Device)
A first embodiment will be described. In the present embodiment, as the electronic device, a wearable device that is directly or indirectly attachable to and detachable from a human body and has a portable size will be described as an example. More specifically, a wristband type electronic device which is one of wearable devices will be described as an example.

Figure 1:
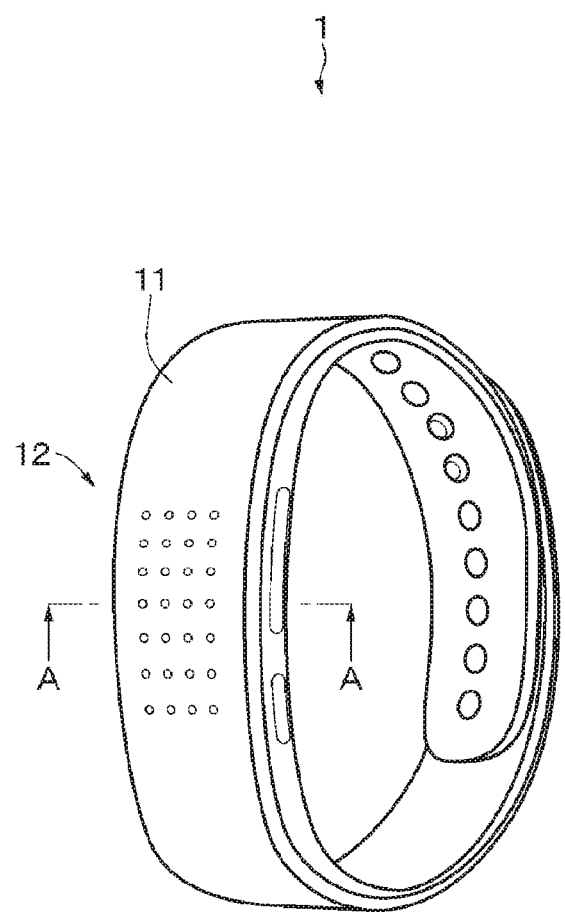
FIG. 1 is a view illustrating an example of an external appearance of a wristband type electronic device according to an embodiment.

FIG. 1 illustrates an example of an external appearance of a wristband type electronic device (wristband type electronic device 1) according to the first embodiment. As illustrated in FIG. 1, the wristband type electronic device 1 is used, for example, like a wrist watch. The wristband type electronic device 1 has a band portion 11 that can be folded so that it can be wrapped around a user's wrist. Note that in the following description, a main surface of the band portion 11 located on the wrist side of the user when the wristband type electronic device 1 is in use may be referred to as a back surface, and an opposite main surface may be referred to as a front surface.

A plurality of holes is provided in a part of the band portion 11. In FIG. 1, a plurality of holes is indicated by circles. Although details will be described later, a light emitting unit is provided at a bottom of each hole. Light emitted from the light emitting unit passes through the hole and is visually recognized by the user. Predetermined information is presented to the user by appropriately controlling the light emitting unit that emits light. That is, the position of the band portion 11 where the plurality of holes is provided functions as a display 12 that presents predetermined information.

A constituent body (material) forming the band portion 11 may be metal such as aluminum or stainless steel (which may be surface-processed by applying gold plating or the like), or may be leather, wood, mineral (stone), fiber (cloth), bamboo, ceramic, a combination of any of these, or the like. The constituent body forming the band portion 11 may be a light transmitting member or a light non-transmitting member. Note that the light non-transmitting member may be a member that does not transmit light at all, or a member that transmits light slightly smaller than a predetermined value. In the present embodiment, it is possible that, not what is called a device dedicated for display such as liquid crystal display (LCD) and organic light emitting diode (OLED), but the constituent body itself forming the band portion 11 functions as a display. Thus, the design and texture of the electronic device can be improved.

(Circuit Configuration Example of Wristband Type Electronic Device)

Figure 2:
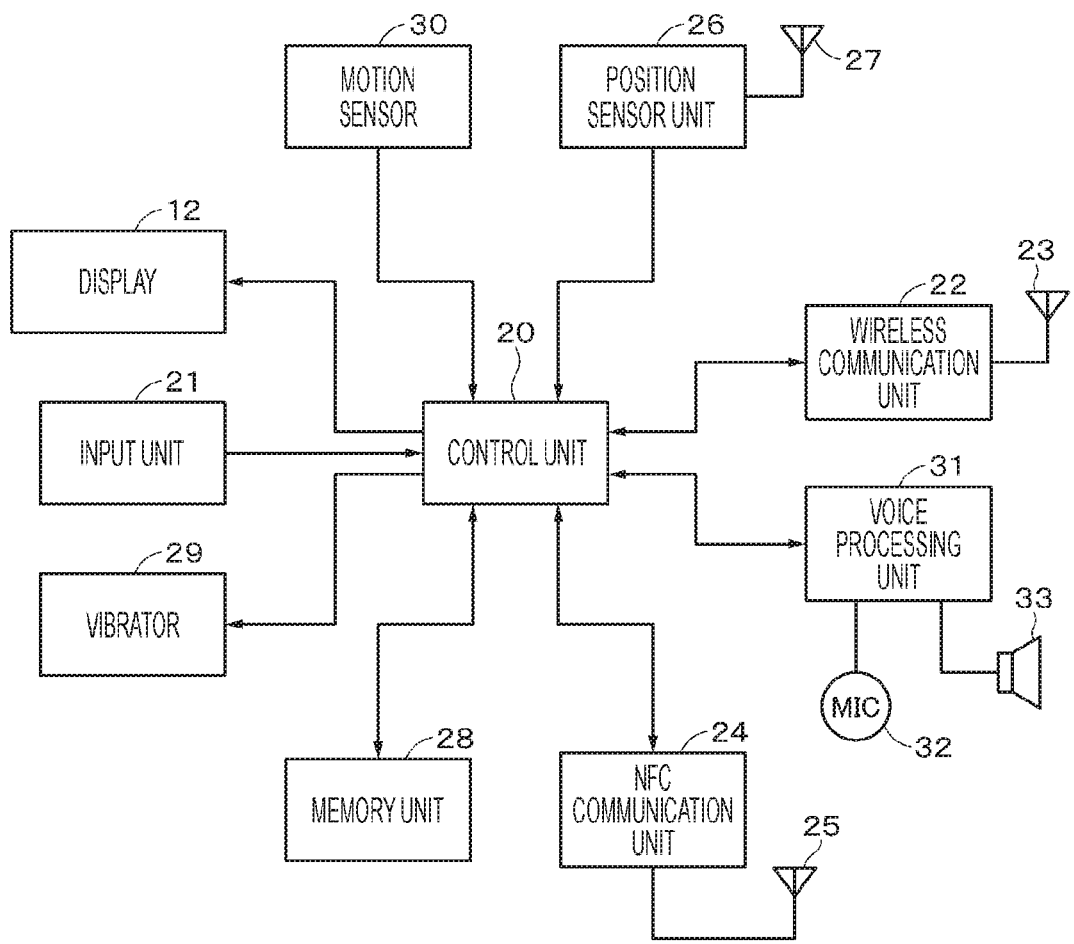
FIG. 2 is a diagram illustrating a circuit configuration example of the wristband type electronic device according to the embodiment.

FIG. 2 is a block diagram illustrating a circuit configuration example of the wristband type electronic device 1. The wristband type electronic device 1 has, in addition to the display 12 described above, for example, a control unit 20, an input unit 21, a wireless communication unit 22, an antenna 23 connected to the wireless communication unit 22, a near field communication (NFC) communication unit 24, an antenna 25 connected to the NFC communication unit 24, a position sensor unit 26, an antenna 27 connected to the position sensor unit 26, a memory unit 28, a vibrator 29, a motion sensor 30, a voice processing unit 31, a microphone 32, and a speaker 33.

The control unit 20 includes, for example, a central processing unit (CPU), and controls each unit of the wristband type electronic device 1.

The input unit 21 is a general term for a configuration of the wristband type electronic device 1 for receiving an operation input. Examples of the input unit 21 include a touch panel, buttons, dials and the like. Note that the input unit 21 may be configured to receive a voice input for performing voice recognition (for example, the speaker 33).

The wireless communication unit 22 performs short-range wireless communication with another terminal on the basis of, for example, the Bluetooth (registered trademark) standard. The wireless communication unit 22 performs modulation-demodulation processing, error correction processing, and the like corresponding to, for example, the Bluetooth (registered trademark) standard.

The NFC communication unit 24 performs wireless communication with a nearby reader-writer on the basis of NFC standards. Note that although illustration is omitted, electric power is supplied to each part of the wristband type electronic device 1 from a battery such as a lithium ion secondary battery. The battery may be wirelessly charged on the basis of the NFC standards.

The position sensor unit 26 is a positioning unit that performs positioning of the current position using, for example, a system called global navigation satellite system (GNSS). The data obtained by these wireless communication unit 22, NFC communication unit 24, and position sensor unit 26 are supplied to the control unit 20. Then, the control unit 20 executes control based on the supplied data.

The memory unit 28 is a general term for a read only memory (ROM) that stores a program executed by the control unit 20, a random access memory (RAM) used as a work memory when the control unit 20 executes the program, a non-volatile memory for storing data, and the like.

The vibrator 29 is, for example, a member that vibrates the entire wristband type electronic device 1. The vibration of the vibrator 29 notifies of an incoming call, an electronic mail, or the like.

The motion sensor 30 detects movement of the user wearing the wristband type electronic device 1. As the motion sensor 30, an acceleration sensor, a gyro sensor, an electronic compass, a barometric pressure sensor, or the like is used. Note that the wristband type electronic device 1 may include a sensor other than the motion sensor 30. For example, a biosensor may be incorporated that detects biological information other than fingerprints, such as blood pressures, pulses, sweat glands (position of sweat glands or the degree of sweating from the sweat glands may be used), body temperatures, or the like of the user wearing the wristband type electronic device 1. Furthermore, a pressure sensor or the like for detecting whether or not the user wears the wristband type electronic device 1 may be provided on a back side of the band portion 11.

A microphone 32 and a speaker 33 are connected to the voice processing unit 31, and the voice processing unit 31 performs a process of a call with a partner connected by wireless communication at the wireless communication unit 22. Furthermore, the voice processing unit 31 can also perform a process for a voice input operation.

[Example of Internal Structure of Wristband Type Electronic Device]

Figure 3:
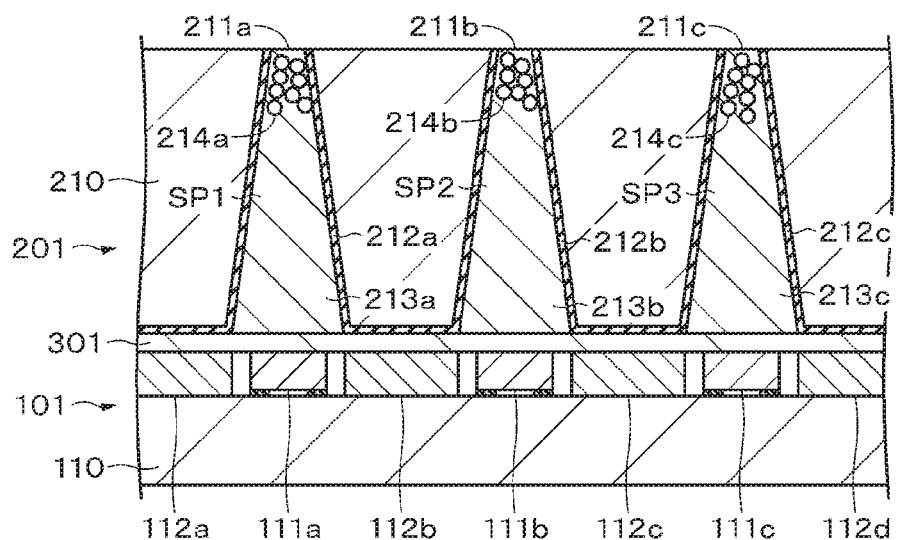
FIG. 3 is a partial cross-sectional view illustrating an example of an internal structure of a wristband type electronic device according to a first embodiment.

Next, an example of an internal structure of the wristband type electronic device 1 according to the first embodiment will be described. FIG. 3 is a partial cross-sectional view of the wristband type electronic device 1 taken along a cutting line A-A illustrated in FIG. 1. The wristband type electronic device 1 has, as its internal structure, a first structure 101 located on a back surface side of the wristband type electronic device 1 and a second structure 201 located on a front surface side of the wristband type electronic device 1. The first structure 101 and the second structure 201 are adhered to each other via an adhesive layer 301. The adhesive layer 301 transmits light from the light emitting unit described later, and thus the adhesive layer 301 is preferably formed by an adhesive having high transparency even after curing. The thickness of the first structure is, for example, about 300 microns.

Structural Example of First Structure

The first structure 101 includes a substrate 110. The substrate 110 is a flexible printed circuit board, a substrate formed by glass epoxy resin, a multilayer substrate of these substrates, or the like. A predetermined circuit pattern is formed on the substrate 110, and a plurality of light emitting units that is appropriately connected to the circuit pattern is mounted. The light emitting unit has a light emitter that actually emits light. The light emitter according to the present embodiment is, for example, a light emitting diode (LED), and the light emitting unit according to the present embodiment is an LED chip having the LED. Note that in the following description, in order to facilitate understanding, the description may be simplified as an LED even when an LED chip is illustrated.

In FIG. 3, three LEDs 111a, 111b, and 111c are illustrated on the substrate 110. Note that when it is not necessary to distinguish individual LEDs, they will be appropriately referred to as an LED 111. The LED 111 generates white light, for example. Examples of the method for generating white light include a method using an RGB LED, a method using a blue LED and a yellow phosphor, a method using a blue LED and red and green phosphors, and the like. From the viewpoint of energy efficiency, the method using a blue LED and a phosphor is preferable. Note that although details will be described later, the phosphor is provided near the opening.

A light shielding plate as a light shielding portion is provided between LEDs 111. In FIG. 3, four light shielding plates 112a, 112b, 112c, and 112d are illustrated. Note that when it is not necessary to distinguish individual light shielding plates, they will be appropriately referred to as a light shielding plate 112. The four light shielding plates 112a, 112b, 112c, and 112d may be separate ones, but in the present embodiment, they are integrated. That is, a light shielding plate 112 having a shape corresponding to the arrangement shape of the plurality of LEDs 111 is fitted into the substrate 110. For example, the light shielding plate 112 has a grid shape, and the LEDs 111 are arranged in the frame of grids.

Structural Example of Second Structure

The second structure 201 includes a base 210. The base 210 has a configuration corresponding to the band portion 11. As described above, the base 210 can include metal, leather, wood, and the like. A plurality of holes is formed in the base 210. The plurality of holes is formed by using a device such as a laser, a water pressure, or a needle, or the like. A plurality of internal spaces is formed in the base 210 corresponding to the holes. In FIG. 3, three internal spaces SP1, SP2, and SP3 are illustrated. Note that when it is not necessary to distinguish the individual internal spaces, they will be appropriately referred to as an internal space SP. The shape of the internal space SP is a tapered shape that tapers toward an opening described later. Specifically, the internal space SP can have a shape such as a truncated cone shape, a truncated pyramid shape, or an artillery shell shape. With such a shape, light extraction efficiency of the light emitted from the LED 111 can be improved. Note that among the shapes illustrated, the artillery shell shape is preferable from the viewpoint of light extraction efficiency.

The internal space SP communicates with a space in which the LEDs 111 are arranged (a space between adjacent light shielding plates 112) via an adhesive layer 301. Furthermore, a tip on a front surface side of the internal space SP is an opening communicating with the outside, and the light emitted from the LED 111 is guided to the outside through this opening. In the example illustrated in FIG. 3, a tip side of the internal space SP1 is an opening 211a, a tip side of the internal space SP2 is an opening 211b, and a tip side of the internal space SP3 is an opening 211c. Note that when it is not necessary to distinguish between the individual openings, they will be appropriately referred to as an opening 211. As described above, in the present embodiment, one corresponding opening 211 is provided for every LED 111. The width of the opening 211 is, for example, about 30 μm in a case where the surface is mirror-finished and about 70 μm in a case where the surface is hairline-finished. Of course, the width of the opening 211 is not limited to the illustrated width.

A reflective film is formed on at least a surface of the internal space SP. For example, a reflective film 212a is formed on a surface of the internal space SP1. A reflective film 212b is formed on a surface of the internal space SP2. A reflective film 212c is formed on a surface of the internal space SP3. Note that when it is not necessary to distinguish the individual reflective films, they will be appropriately referred to as a reflective film 212. The reflective film 212 can be formed by plating nickel, gold, silver, or the like. Note that in the present embodiment, the reflective film 212 is also formed on a surface of a back surface side of the base 210.

The internal space SP is filled with a transparent resin which is an example of a filler. For example, the internal space SP1 is filled with a transparent resin 213a. The internal space SP2 is filled with a transparent resin 213b. The internal space SP3 is filled with a transparent resin 213c. Note that when it is not necessary to distinguish the individual transparent resins, they will be referred to as a transparent resin 213. The filler according to the present embodiment is, for example, a thermosetting transparent resin having high transparency. Silicon resin or the like can be mentioned as such a transparent resin.

The transparent resin 213 according to the present embodiment includes a re-emitting unit as a re-emitter. Here, the re-emitter means a material that emits light by receiving the light of the LED 111. In the present embodiment, a phosphor will be described as an example of the re-emitter, but other substances (for example, quantum dots) may be used. The type (color) of the phosphor is appropriately set, for example, according to the method of generating white light.

The phosphor is provided so as to be stored at a tip of the internal space, that is, near the opening (near the opening). For example, the phosphor 214a is stored near the opening 211a in the internal space SP1. The phosphor 214b is stored near the opening 211b of the internal space SP2. The phosphor 214c is stored near the opening 211c of the internal space SP3. Note that when it is not necessary to distinguish individual phosphors, the phosphors will be appropriately referred to as a phosphor 214.

[Example of LED Chip Layout]

From the viewpoint of display, it is preferable that a pitch in a vertical direction and a pitch in a horizontal direction of chips having the LED 111 (hereinafter appropriately referred to as LED chip) in plan view are substantially equal. "Almost equal" means, in addition to that the pitches in the vertical direction and the horizontal direction are equal to each other, an error that may occur in a manufacturing process is tolerated.

Generally used LED chips often have an aspect ratio of 1:2. In this case, in order to make the pitches in the vertical direction and the horizontal direction substantially equal, it is necessary to increase the pitch between adjacent LED chips on one side (for example, the horizontal direction) with respect to a certain LED chip, and thus efficient arrangement is not possible. Therefore, it is desired that the pitches in the vertical directions and the horizontal direction are substantially equal and the LED chips are efficiently arranged.

Figure 4:
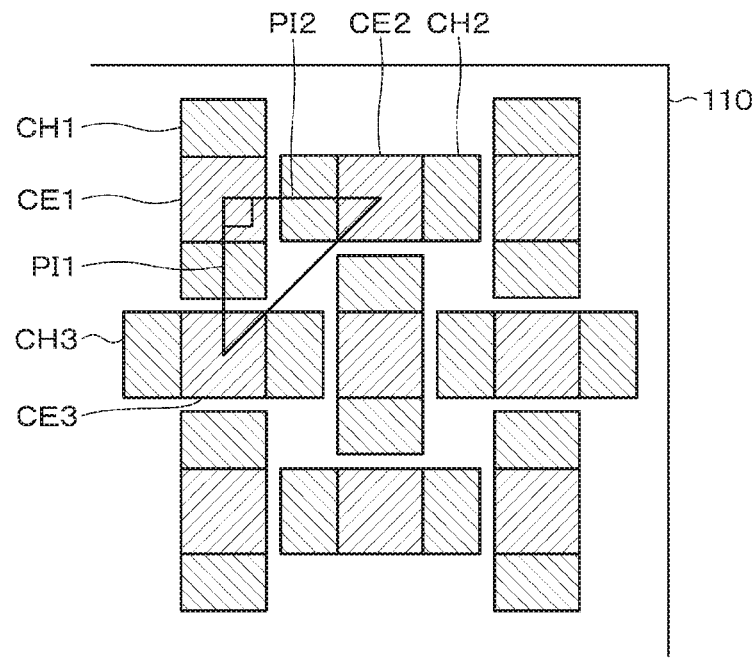
FIG. 4 is a view for describing an arrangement example of LED chips according to the first embodiment.

A specific arrangement example of the LED chips will be described. FIG. 4 is a view illustrating an arrangement example of the LED chips. A predetermined LED chip CH1 is mounted on the substrate 110. An LED 111 is located at a predetermined position in an area CE1 that is near the center of the LED chip CH1. In the example illustrated in FIG. 4, when the substrate 110 is viewed in plan view, an LED chip CH2 is arranged on a right side of the LED chip CH1 and an LED chip CH3 is arranged below the LED chip CH1.

For example, arrangement directions of the adjacent LED chips are made different in either of the vertical and horizontal directions. Specifically, the direction of the LED chip CH2 is inclined about 90° with respect to the direction of the LED chip CH1. Similarly, the direction of the LED chip CH3 is inclined about 90° with respect to the direction of the LED chip CH1. With such an arrangement, a pitch PI1 that is the pitch in the vertical direction between the adjacent LED chips and a pitch PI2 that is the pitch in the horizontal direction can be made substantially equal. Furthermore, with such an arrangement, it is possible to increase strength against bending of the substrate 110 that occurs when the wristband type electronic device 1 is used.

Figure 5:
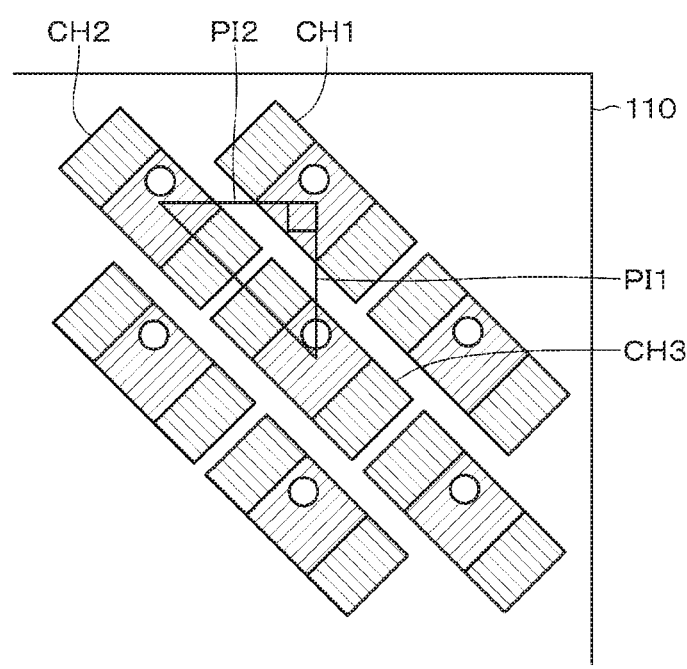
FIG. 5 is a view for describing another arrangement example of the LED chips according to the first embodiment.

FIG. 5 is a view illustrating another arrangement example of the LED chips. For example, each LED chip is arranged at an angle of 45° with respect to the vertical direction (or horizontal direction) of the rectangular substrate 110. For example, the LED chips CH1, CH2, and CH3 are arranged at an angle of 45° with respect to the vertical direction of the substrate 110. Also with such an arrangement, the pitch PI1 that is the pitch in the vertical direction between the adjacent LED chips and the pitch PI2 that is the pitch in the horizontal direction therebetween can be made substantially equal. Furthermore, according to the arrangement example illustrated in FIG. 5, the LED chips can be arranged more efficiently.

Note that in the above example, the pitch is defined by the length between the center positions of the LED chips, but the pitch may be defined by a length between light emitting points (light emitting points). Thus, light emission positions with respect to the internal spaces SP can be made the same, and light unevenness when the LEDs 111 emit light can be reduced.

[Example of Operation of Wristband Type Electronic Device]

Figure 6:
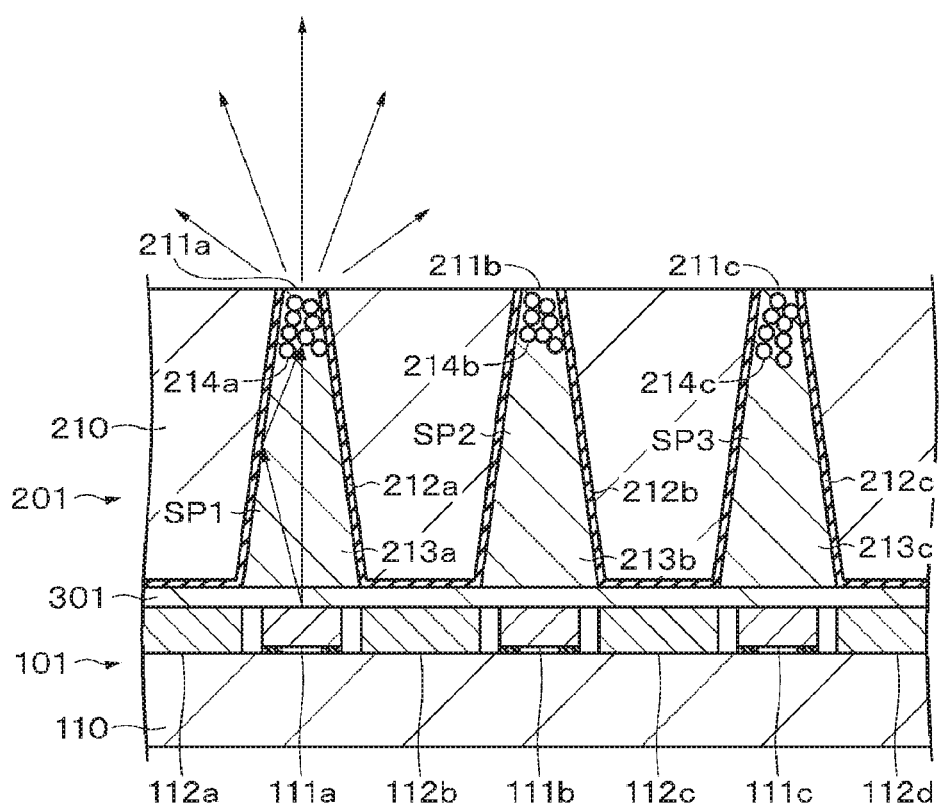
FIG. 6 is a view for describing an operation example of the wristband type electronic device according to the first embodiment.

An operation example of the wristband type electronic device 1 will be described with reference to FIG. 6. When the LED 111 emits light, the light emitted from the LED 111 is guided toward the opening 211 while being reflected by the reflective film 212 in the internal space SP. The phosphor 214 stored near the opening 211 emits light by the light from the LED 111. Note that FIG. 6 illustrates an example in which the LED 111a emits light, and the light emitted from the LED 111a is schematically illustrated by an arrow. By appropriately controlling the LED 111 that emits light among the plurality of LEDs 111, predetermined information is presented to the user.

Example of Effects

An example of effects obtained by the structural example of the wristband type electronic device 1 according to the present embodiment will be described.

In the wristband type electronic device 1 according to the present embodiment, the phosphor 214 is stored in the vicinity of the opening 211, which is a place visually recognized by the user. With such a configuration, it is possible to obtain the effect of preventing foreign matter (water, dust, or the like) from entering the internal space SP.

In a case where the texture of the wristband type electronic device 1 is improved, the thickness of the base 210 may be set to a certain value or more depending on the constituent body of the band portion 11. Furthermore, in a case where a blue LED is used as the LED 111, the blue LED has a characteristic that, although it is energy efficient, it does not look visually bright. Therefore, when the phosphor 214 is provided on the LED chip side, there is a constant distance to the opening 211. Thus, there is a risk of reducing brightness of the LED 111 presented to the user through the opening 211, and reducing a viewing angle. However, in this embodiment, since the phosphor 214 is provided near the opening 211 and the phosphor 214 is configured to emit light near the opening 211, such a problem can be avoided, and the viewing angle can be improved.

Furthermore, for example, let us consider a case where control is performed such that the LED 111a emits light and the LED 111b does not emit light. In the wristband type electronic device 1 according to the present embodiment, by providing the phosphor 214 near the opening 211, the distance between the LED 111 and the phosphor 214 can be increased. Thus, even if the light from the LED 111a leaks slightly to an adjacent internal space (in this example, the internal space SP2), the slight leaked light is attenuated until the leaked light reaches the phosphor 214b. Thus, it is possible to suppress re-emission of the phosphor 214b due to the leaked light as much as possible. As described above, a leaked light reduction effect can be obtained, and it is possible to prevent deterioration in vividness of the display.

In the wristband type electronic device 1 according to the present embodiment, the light shielding plate 112 is provided among the LEDs 111. With such a configuration, it is possible to suppress light leakage of light emitted from the adjacent LEDs 111, and thus it is possible to improve efficiency of extracting the light of the LEDs 111 and prevent deterioration in vividness of the display.

In the wristband type electronic device 1 according to the present embodiment, the reflective film 212 is formed on the surface of the internal space SP. With such a configuration, the light emitted from the LED 111 can be suppressed as much as possible from being attenuated before reaching the phosphor 214, and thus light extraction efficiency can be improved. Furthermore, the viewing angle can be improved. As described above, the wristband type electronic device 1 according to the present embodiment can improve display performance.

[Method for Manufacturing Wristband Type Electronic Device]

(Method for Manufacturing First Structure)

Next, an example of a method for manufacturing the wristband type electronic device 1 will be described. First, a method for manufacturing the first structure 101 will be described.

A plurality of LED chips is mounted on the substrate 110. A light shielding plate 112 having a shape corresponding to the arrangement of the LED chips is provided. The light shielding plate 112 is formed by, for example, stereolithography. For example, after a photocurable resin is applied in a grid pattern, the photocurable resin is cured by irradiation with light such as ultraviolet rays to form the light shielding plate 112. The first structure 101 is formed as described above.

(Method for Manufacturing Second Structure)

Next, a method for manufacturing the second structure 201 will be described with reference to FIGS. 7A to 7F. Note that the description will be given assuming that the base 210 has holes already formed therein, and the reflective film 212 has already been formed on a surface of the internal space SP.

Figure 7:
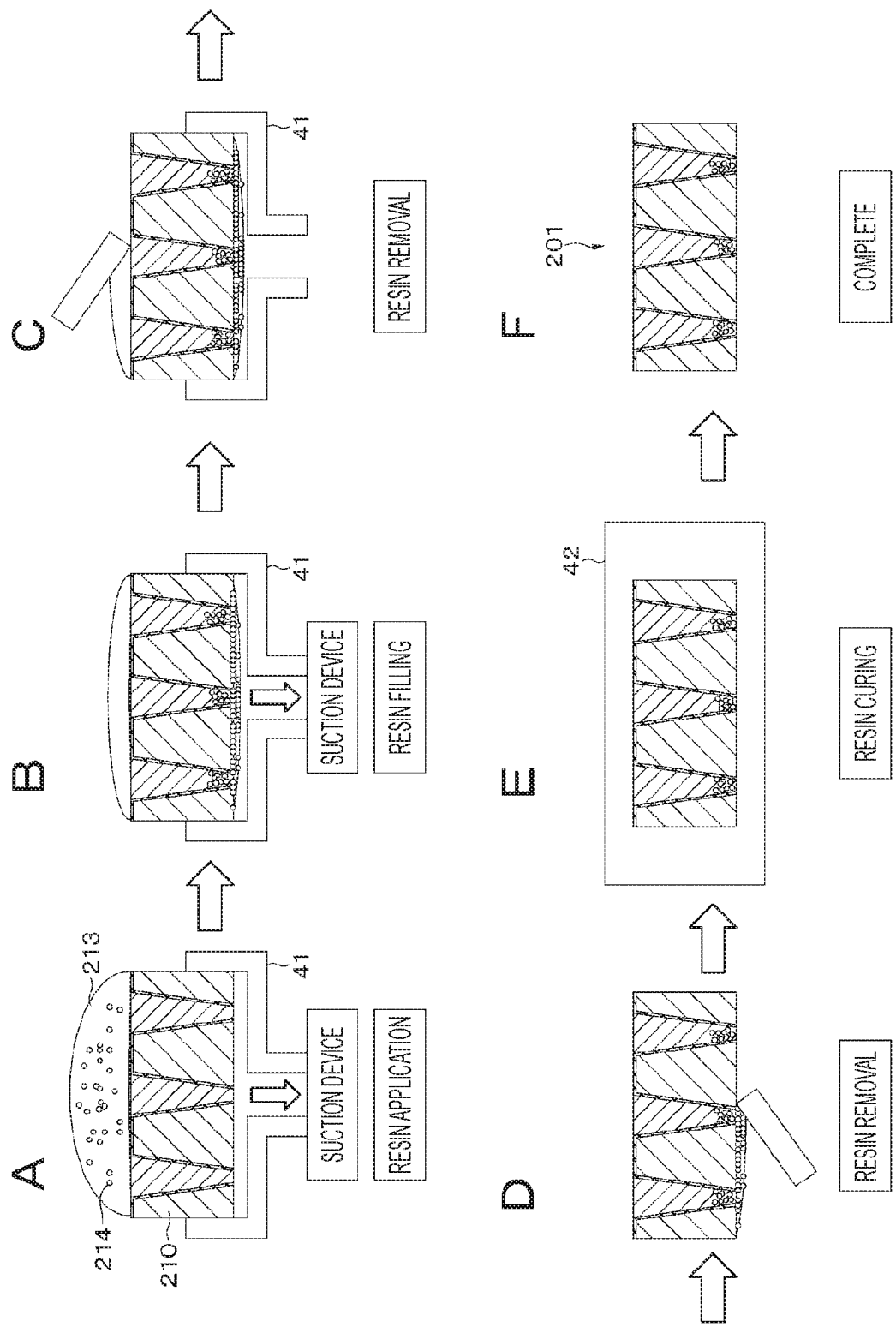
FIG. 7A to FIG. 7F are views for describing an example of a method for manufacturing the wristband type electronic device according to the first embodiment.

As illustrated in FIG. 7A, the base 210 is supported so that the opening 211 is housed in a chamber 41. Then, after the transparent resin 213 including the phosphor 214 is applied to a surface of the base 210 opposite to the surface in which the opening 211 is provided, evacuation is performed with a suction device such as a decompression pump or a vacuum ejector (an example of a filling unit). By this process, as illustrated in FIG. 7B, the transparent resin 213 is filled in the internal space SP. At this time, since the transparent resin 213 and the phosphor 214 have different specific gravities, the phosphor 214 can be stored near the opening 211.

After evacuation is performed for a predetermined time, evacuation is stopped as illustrated in FIG. 7C. Then, an unnecessary transparent resin 213 remaining on the side of the base 210 opposite to the opening 211 is removed.

Next, as illustrated in FIG. 7D, after the opening 211 side of the base 210 is moved out of the chamber 41, the unnecessary transparent resin 213 remaining on the opening 211 side of the base 210 is removed.

Next, as illustrated in FIG. 7E, after the base 210 and the like are housed in a predetermined housing 42, the base 210 are the like are irradiated with light such as ultraviolet rays by a filler curing unit such as an ultraviolet lamp or a heater. Thus, the transparent resin 213 is cured and the phosphor 214 is provided so as to be stored near the opening 211. Through the above steps, the second structure 201 is formed as illustrated in FIG. 7F.

Although not illustrated, the first structure 101 and the second structure 201 formed as described above are adhered to each other with the adhesive layer 301, to thereby manufacture the wristband type electronic device 1. Of course, while the preferred method for manufacturing the wristband type electronic device 1 has been described, the wristband type electronic device 1 may be manufactured by a manufacturing method with other processes. Note that the present disclosure can also be configured as an apparatus for manufacturing an electronic device, the apparatus performing the above-described manufacturing method.

2. Second Embodiment

Next, a second embodiment will be described. Note that the matters described in the first embodiment can be applied to the second embodiment unless otherwise specified. Note that in order to prevent illustrations from becoming complicated, reference numerals are given only to a part of the components, and the same hatching is given to the same components.

Figure 8:
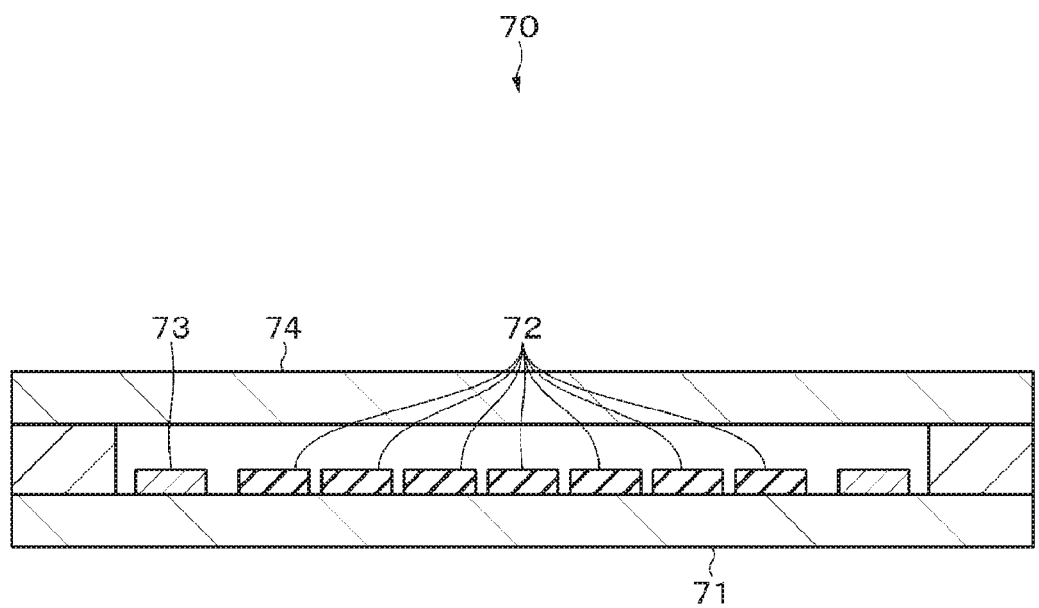
FIG. 8 is a view illustrating a structure of a general organic EL panel.

In the second embodiment, an organic electroluminescence (EL) element is applied as the light emitting unit. FIG. 8 is a view illustrating a structure of a general organic EL panel (organic EL panel 70) using an organic EL element. The organic EL panel 70 has a substrate 71, an organic EL element 72 and a wiring part 73 mounted on the substrate 71, and a cover glass 74 provided so as to face the substrate 71. A space between the substrate 71 and the cover glass 74 is sealed, and the sealed internal space is filled with an inert gas or the like.

A technique is conceivable such that the cover glass 74 of the organic EL panel 70 having such a structure is provided with the base having the openings described in the first embodiment, where light guided by the openings is visually recognized. However, this structure has a problem that light emitted by the organic EL element 72 is diffused and visibility is insufficient. Based on the above points, the second embodiment will be described in detail.

[Example of Internal Structure of Wristband Type Electronic Device]

An example of an internal structure of a wristband type electronic device (wristband type electronic device 1A) according to the second embodiment will be described. Note that as for the external appearance and circuit configuration of the wristband type electronic device 1A, the contents described in the first embodiment can be applied.

Figure 9:
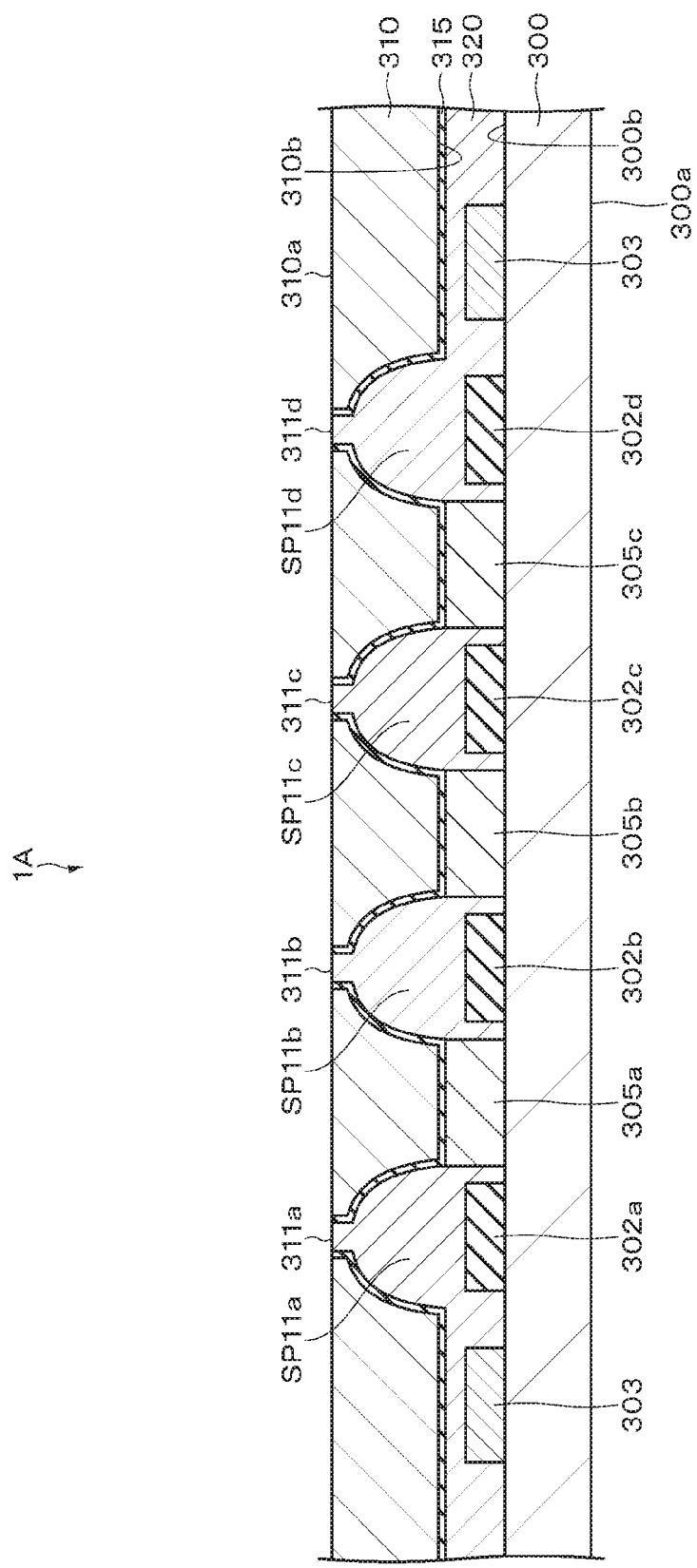
FIG. 9 is a partial cross-sectional view illustrating an example of an internal structure of a wristband type electronic device according to a second embodiment.

FIG. 9 is a partial cross-sectional view of the wristband type electronic device 1A cut at the same position as the cutting line A-A illustrated in FIG. 1, for example. The wristband type electronic device 1A schematically has a glass substrate 300, which is an example of a substrate, and a base 310 provided so as to face the glass substrate 300. An organic EL element 302 as a light emitting element and a wiring part 303 having a predetermined pattern are provided on the glass substrate 300. In FIG. 9, four organic EL elements (organic EL elements 302a, 302b, 302c, and 302d) are illustrated. Note that in the following description, when it is not necessary to distinguish the individual organic EL elements, they will be referred to as an organic EL element 302. The organic EL element 302 according to the present embodiment is, for example, an element that emits a single color (for example, blue).

Light shielding walls as light shielding portions are provided at positions between the respective organic EL elements 302 on the glass substrate 300. In the example illustrated in FIG. 9, a light shielding wall 305a is provided between the organic EL element 302a and the organic EL element 302b. A light shielding wall 305b is provided between the organic EL element 302b and the organic EL element 302c. A light shielding wall 305c is provided between the organic EL element 302c and the organic EL element 302d. Note that in the following description, when it is not necessary to distinguish the individual light shielding walls, they will be referred to as a light shielding wall 305. The light shielding wall 305, for example, is formed simultaneously in the film formation process of the organic EL element 302, and has a lattice shape or the like. Note that an upper surface of the light shielding wall 305 may be in contact with an opposing surface of the base 310, so that the light shielding wall 305 supports the base 310. Thus, the base 310 can be stably positioned.

Similarly to the base 210, the base 310 includes a light transmitting member (including a light transmitting member having light transmittance that is essentially not high) or a light non-transmitting member. A plurality of openings is formed in one main surface (a main surface opposite to the opposing surface that opposes the glass substrate 300) 310a of the base 310. In FIG. 9, four openings (openings 311a, 311b, 311c, and 311d) are illustrated. Note that in the following description, when it is not necessary to distinguish the individual openings, they will be referred to as an opening 311. The opening 311 can be formed by an appropriate method such as etching or laser processing.

The base 310 has an internal space which has an open end on an opposing surface 310b and communicates with the opening 311. Specifically, in the base 310, an internal space SP11a communicating with the opening 311a is formed, an internal space SP11b communicating with the opening 311b is formed, an internal space SP11c communicating with the opening 311c is formed, and an internal space SP11d communicating with the opening 311d is formed. Note that in the following description, when it is not necessary to distinguish the individual internal spaces, they will be referred to as an internal space SP11.

The internal space SP11 has a tapered shape as a whole from the opposing surface 310b side toward the opening 311 side, and more specifically has an artillery shell shape. The shape of the internal space SP11 may be a truncated cone shape or a truncated quadrangular pyramid shape. At least a reflective film 315 is provided on a surface of the internal space SP11. In the present embodiment, the reflective film 315 is provided over the entire opposing surface 310b including the surface of the internal space SP11.

The opening 311 and the internal space SP11 are provided corresponding to every organic EL element 302. Specifically, the internal space SP11a communicating with the opening 311a is formed above the organic EL element 302a, the internal space SP1b communicating with the opening 311b is formed above the organic EL element 302b, the internal space SP1c communicating with the opening 311c is formed above the organic EL element 302c, and the internal space SP11d communicating with the opening 311d is formed above the organic EL element 302d.

By making the shape of the internal space SP11 tapered, light extraction efficiency of light emitted from the organic EL element 302 can be improved. Furthermore, by the configuration including the light shielding walls 305, it is possible to suppress light leakage of the light emitted from the adjacent organic EL element 302. Thus, it is possible to improve the light extraction efficiency of the organic EL element 302, and it is possible to prevent deterioration in vividness. Furthermore, by the configuration including the reflective film 315 on the surface of the internal space SP11, it is possible to prevent light emitted from the organic EL element 302 from being attenuated until reaching the opening 311, and thus the light extraction efficiency can be improved. Furthermore, the viewing angle can be improved. As described above, by the wristband type electronic device 1A of the present embodiment, display performance can be improved as compared with the above-described method of applying the general organic EL panel.

Note that in a case where an organic EL element is used as the light emitting unit, it is necessary to enhance a barrier property against moisture, air, and the like in order to prevent corrosion and the like of the organic EL element. Therefore, in the present embodiment, as illustrated in FIG. 9, a resin layer 320 for sealing a space between the glass substrate 300 and the base 310 is formed by filling a resin in the space between the glass substrate 300 and the base 310. Note that the space between the glass substrate 300 and the base 310 is a space including the internal space SP11. As the resin forming the resin layer 320, a photocurable resin such as an ultraviolet curable resin or a thermosetting resin can be applied, and it is preferable that the resin layer 320 has high transparency so that the light emitted from the organic EL element 302 is not attenuated as much as possible. However, the resin layer 320 may be milky white or the like instead of being transparent.

By providing the resin layer 320, a barrier property of the organic EL element 302 can be improved. Furthermore, since the resin layer 320 also functions as an adhesive layer that adheres the glass substrate 300 and the base 310, it is no longer necessary to provide an adhesive layer. Furthermore, in a case where the base 310 includes a material having excellent heat dissipation property, such as metal, the heat emitted from the organic EL element 302 can be transferred to the base 310 due to presence of the resin layer 320 and can be dissipated from the base 310. Therefore, life of the organic EL element 302 can be extended. Furthermore, although efficient light emission can be obtained in a case where an LED is applied as the light emitting unit, the LEDs need to be individually mounted, and there is a risk that pitches of arrangement will be restricted and the cost will increase. On the other hand, in a case where an organic EL element is applied as the light emitting unit, these problems can be suppressed as much as possible.

[Method for Manufacturing Wristband Type Electronic Device]

Next, an example of a method for manufacturing the wristband type electronic device 1A will be described. The organic EL element 302, the wiring part 303, and the light shielding wall 305 are formed on the glass substrate 300 by applying known manufacturing processes. After the resin forming the resin layer 320 is applied to the glass substrate 300 on which the organic EL element 302 is formed, the base 310 in which the internal space SP11 and the opening 311 are formed is positioned at a predetermined position on the glass substrate 300. Then, by performing a process of curing the resin (for example, irradiation with ultraviolet rays, or the like), the resin layer 320 is formed, and the wristband type electronic device 1A is manufactured. As described above, a part of manufacturing processes of the organic EL display can be applied to manufacturing processes of the wristband type electronic device 1A.

The manufacturing method described above is an example, and the present invention is not limited to this. For example, resin may be injected through the opening 311 after the glass substrate 300 and the base 310 are positioned. Furthermore, as described in the first embodiment, the wristband type electronic device 1A may have a configuration in which the phosphor is stored near the opening 311. In a case of such a configuration, after a resin containing the phosphor is applied to the glass substrate 300 and the base 310 is positioned, the resin may be cured after the phosphor is stored in the opening 311 by suction or turning the integrated object upside down.

Modification Example of Second Embodiment

Modification Example of Substrate

Figure 10:
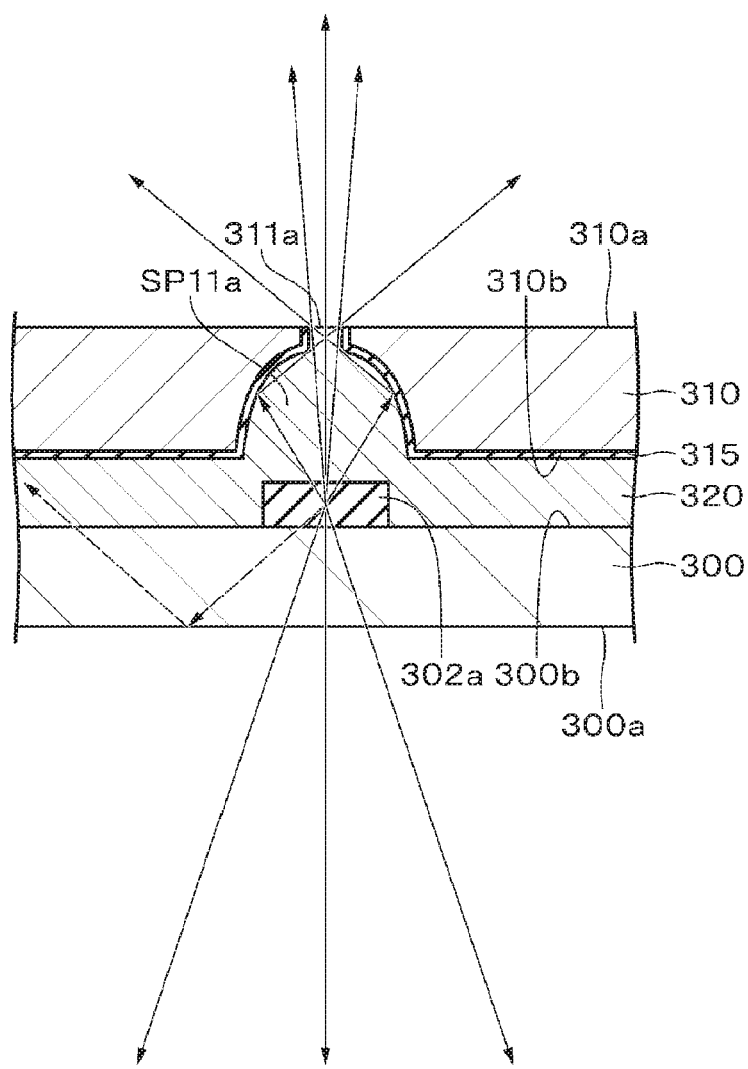
FIG. 10 is a view for describing a problem to be considered in the second embodiment.

The following modifications can be made to the second embodiment described above. As described above, the organic EL element is generally provided on the glass substrate in many cases. In a case of such a configuration, as schematically illustrated in FIG. 10, light emitted from the light emitting unit (for example, the organic EL element 302a) may escape from the back surface 300a side of the glass substrate 300. In order to prevent this, it is conceivable to provide the back surface 300a of the glass substrate 300 with a reflective layer that reflects light from the organic EL element 302a. However, when the reflective layer is provided on the back surface 300a, light reflected by the reflective layer easily leaks to an adjacent region (which is a region partitioned by the light shielding wall 305 and may be an adjacent pixel) due to the thickness of the glass substrate 300. Thus, a phenomenon occurs in which the opening 311 that is originally not supposed to shine shines.

Accordingly, as illustrated in FIG. 11A, a plating layer 331 as a reflective layer is formed on the opposing surface 300b of the glass substrate 300 as a support. As the plating layer 331, a plated layer of nickel, gold, silver or the like can be applied. Then, a transparent insulating layer 332 is formed on the plating layer 331 (on a surface opposite to the glass substrate 300 side), and the organic EL element 302 is provided on the transparent insulating layer 332. As the transparent insulating layer 332, an insulating film such as polyimide or polyethylene terephthalate (PET) can be applied. Note that the plating layer 331 and the transparent insulating layer 332 can be formed by a known method such as sputtering. As described above, the substrate may be not only a glass substrate but also an insulating film-shaped one as exemplified by the transparent insulating layer 332.

With the configuration illustrated in FIG. 11A, light emitted from the light emitting unit (for example, the organic EL element 302a) can be reflected by the plating layer 331 toward the opening 311 (opening 311a in the illustrated example) side. Note that since the transparent insulating layer 332 has a small thickness of several microns, the amount of light leaking to an adjacent region through the transparent insulating layer 332 is negligibly small. Note that in order to prevent light from leaking to the adjacent region, a region where the transparent insulating layer 332 does not exist may be provided by masking when forming the transparent insulating layer 332, and the light shielding wall 305 may be formed in the region where the transparent insulating layer 332 does not exist. Furthermore, as illustrated in FIG. 11B, the transparent insulating layer 332 may be provided on a metal substrate 341 of stainless steel or the like which is an example of a light reflecting member, instead of the glass substrate 300. A similar effect can be obtained by such a configuration.

Modification Example of Light Emitting Unit

Next, a modification example of the light emitting unit will be described with reference to FIG. 12. In the above-described embodiment, as illustrated in FIG. 12A, an example has been described in which the light emitting unit includes a plurality of monochromatic organic EL elements 302a. The light emitting element forming the light emitting unit, for example, may have a configuration in which a color filter 351 is provided on the organic EL element 302a as illustrated in FIG. 12B, for example. With such a configuration, light of a desired color can be emitted from the opening 311. For example, by providing a yellow color filter 351 on the blue organic EL element 302a, white light can be generated and emitted from the opening 311. Note that even in a case where the color filter 351 is not provided, white light can be generated by mixing the resin layer 320 with a yellow phosphor.

Furthermore, the light emitting unit may have, for example, a configuration in which light emitting elements of different emission colors, specifically, a blue light emitting organic EL element 302A, a green light emitting organic EL element 302B, and a yellow light emitting organic EL element 302C are stacked as illustrated in FIG. 12C. With the configuration illustrated in FIG. 12C, full-color light emission can be supported. Furthermore, when the light emitting elements of different emission colors are arranged in a plane (two-dimensional), the color visually recognized from the opening 311 may be different depending on the viewing angle, but according to the above-described stacked structure, it is possible to prevent occurrence of such a problem.

Other Modification Examples

In the above description, the example in which the light shielding wall 305 is formed simultaneously as the organic EL element 302 in the formation process of the organic EL element 302 has been described, but the present invention is not limited thereto. For example, the light shielding wall 305 may be formed by a process different from the process of forming the organic EL element 302. Specifically, the light shielding wall 305 may be formed by another process using a resin or an elastic body. Then, the formed light shielding wall 305 may be attached to the glass substrate 300 or the like with an adhesive or an adhesive sheet. Furthermore, the light shielding wall 305 may be integrated with the base 310. Furthermore, in the second embodiment, the organic EL element is exemplified as a preferable light emitting element, but another light emitting element may be applied.

3. Modification Example

Although the embodiment of the present disclosure has been specifically described above, the content of the present disclosure is not limited to the above-described embodiment, and various modifications based on the technical idea of the present disclosure are possible. Hereinafter, modification examples will be described.

In the above-described first embodiment, the light emitting unit is described as an LED chip, but it may be, for example, an LED itself that is through-hole mounted on the substrate 110. Further, a light emitting element other than the LED may be used. Furthermore, in the above-described first embodiment, the configuration in which the re-emitting unit is provided near the opening is described as an example, but a configuration in which the re-emitting unit is directly above the LED or a configuration in which the re-emitting unit is not provided may be employed. Furthermore, in the above-described first embodiment, an example in which the shape of the internal space is tapered has been described, but the shape is not limited to the tapered shape. For example, both open ends (inlet and outlet) of the internal space may have the same shape, and specifically, the internal space may have a cylindrical shape, a quadratic prism shape, or the like.

The electronic device according to the present disclosure is not limited to the wristband type electronic device 1, and may be another mobile device. Further, not only a portable mobile device but also a stationary device placed in a living space, or the like may be used. Furthermore, in recent years, IoT (Internet of Things) devices have attracted attention such that devices that have been used as independent single devices are enabled to exchange information with each other by being connected to a network such as the Internet. It is assumed that such IoT devices will have a configuration having a display. According to the present disclosure, instead of providing an independent display such as an LCD for an IoT device, by providing holes in a casing of an IoT device, the casing itself can function as a display. That is, it becomes possible to provide an IoT device with improved design, texture, and the like.

The configurations, methods, steps, shapes, materials, numerical values, and the like mentioned in the above-described embodiments and modification examples are merely examples, and different configurations, methods, steps, shapes, materials, numerical values, and the like may be used as necessary, or may be replaced with known ones. Furthermore, the configurations, methods, steps, shapes, materials, numerical values, and the like in the embodiments and the modification examples can be combined with each other as long as no technical contradiction occurs. Furthermore, the present disclosure can be implemented in any form such as a control method and an apparatus for manufacturing an electronic device.

The present disclosure can also employ the following configurations.

(1)

An electronic device including:

a plurality of light emitting units mounted on a substrate; and an opening that is provided so as to correspond to each of the light emitting units and guides light emitted from the light emitting unit to an outside.

(2)

The electronic device according to (1), further including a base in which the opening is formed.

(3)

The electronic device according to (2), in which the base has an internal space that communicates with the opening, and a reflective film is formed on a surface of the internal space.

(4)

The electronic device according to (3), in which the internal space has a shape tapered toward the opening.

(5)

The electronic device according to (3), in which a shape of the internal space is any one of a truncated cone shape, a truncated pyramid shape, or an artillery shell shape.

(6)

The electronic device according to any one of (2) to (5), further including a resin layer that seals between the substrate and the base.

(7)

The electronic device according to any one of (1) to (6), further including:

a support including a light transmitting member; and a reflective layer provided on the support, in which the substrate is a transparent insulating layer provided on the reflective layer.

(8)

The electronic device according to any one of (1) to (6), further including a light reflecting member, in which the substrate is a transparent insulating layer provided on the light reflecting member.

(9)

The electronic device according to any one of (1) to (8), in which the light emitting unit has a plurality of light emitting elements.

(10)

The electronic device according to (9), in which the light emitting element has a configuration in which a plurality of organic electroluminescence elements of different emission colors is stacked.

(11)

The electronic device according to any one of (2) to (10), in which the base includes a light non-transmitting member.

(12)

The electronic device according to (11), in which the light non-transmitting member is metal, leather, wood, mineral, fiber, bamboo, ceramic, or a combination of any ones thereof.

(13)

The electronic device according to any one of (1) to (10), further including a light shielding portion provided between the light emitting units.

(14)

The electronic device according to any one of (3) to (5), further including a transparent resin filled in the internal space.

(15)

The electronic device according to any one of (1) to (14), further including a re-emitting unit provided near the opening.

(16)

The electronic device according to (15), in which the re-emitting unit is a phosphor or a quantum dot.

(17)

The electronic device according to any one of (1) to (5), in which pitches in a vertical direction and a horizontal direction between the light emitting units in plan view are substantially equal to each other.

(18)

The electronic device according to any one of (1) to (17), in which the electronic device is configured as a wearable device.

(19)

A method for manufacturing an electronic device, the method including a step of filling a filler containing a re-emitting unit in an internal space that is included in a base and has a shape tapered toward an opening so that the re-emitting unit is stored near the opening, and curing the filled filler.

(20)

An apparatus for manufacturing an electronic device, the apparatus including:

a filling unit that fills a filler containing a re-emitting unit in an internal space that is included in a base and has a shape tapered toward an opening so that the re-emitting unit is stored near the opening; and a filler curing unit that cures the filled filler.

REFERENCE SIGNS LIST

1 Wristband type electronic device
110 Substrate
111 LED
112 Light shielding plate
210 Base
211 Opening
213 Transparent resin
214 Phosphor
300 Glass substrate
302 Organic EL element
311 Opening
310 Base
315 Reflective layer
320 Resin layer
331 Plating layer
332 Transparent insulating layer
341 Metal substrate
SP, SP11 Internal space
CH LED chip
PI1, PI2 Pitch

The invention claimed is:

1. An electronic device comprising:
   a plurality of light emitting units mounted on a substrate; and
   an opening that is provided so as to correspond to each of the light emitting units and guides light emitted from the light emitting unit to an outside, wherein
   the light emitting unit has a plurality of light emitting elements, and
   each light emitting element of the plurality of light emitting elements has a configuration in which light emitting elements of different emission colors are stacked.

2. The electronic device according to claim 1, further comprising
   a base in which the opening is formed.

3. The electronic device according to claim 2, wherein
   the base has an internal space that communicates with the opening, and a reflective film is formed on a surface of the internal space.

4. The electronic device according to claim 3, wherein
   the internal space has a shape tapered toward the opening.

5. The electronic device according to claim 3, wherein
   a shape of the internal space is any one of a truncated cone shape, a truncated pyramid shape, or an artillery shell shape.

6. The electronic device according to claim 3, further comprising
   a transparent resin filled in the internal space.

7. The electronic device according to claim 2, further comprising
   a resin layer that seals between the substrate and the base.

8. The electronic device according to claim 2, wherein
   the base includes a light non-transmitting member.

9. The electronic device according to claim 8, wherein
   the light non-transmitting member is metal, leather, wood, mineral, fiber, bamboo, ceramic, or a combination of any ones thereof.

10. The electronic device according to claim 1, further comprising:
    a support including a light transmitting member; and
    a reflective layer provided on the support,
    wherein the substrate is a transparent insulating layer provided on the reflective layer.

11. The electronic device according to claim 1, further comprising
    a light reflecting member,
    wherein the substrate is a transparent insulating layer provided on the light reflecting member.

12. The electronic device according to claim 1, wherein
    the light emitting elements of different emission colors are organic electroluminescent (EL) elements.

13. The electronic device according to claim 1, further comprising
    a light shielding portion provided between the light emitting units.

14. The electronic device according to claim 1, further comprising
    a re-emitting unit provided near the opening.

15. The electronic device according to claim 14, wherein
    the re-emitting unit is a phosphor or a quantum dot.

16. The electronic device according to claim 1, wherein
    pitches in a vertical direction and a horizontal direction between the light emitting units in plan view are equal to each other.

17. The electronic device according to claim 1, wherein
    the electronic device is configured as a wearable device.

* * * * *